(12) United States Patent
Liu

(10) Patent No.: US 7,910,905 B2
(45) Date of Patent: Mar. 22, 2011

(54) SELF-ALIGNED, PLANAR PHASE CHANGE MEMORY ELEMENTS AND DEVICES

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/509,711

(22) Filed: Aug. 25, 2006

(65) Prior Publication Data

US 2008/0048213 A1      Feb. 28, 2008

(51) Int. Cl.
*H01L 29/02* (2006.01)
(52) U.S. Cl. ......... 257/2; 257/3; 257/4; 257/5; 438/102; 438/103
(58) Field of Classification Search .............. 257/1–5, 257/E29.002; 438/800, 900, 102–103; 365/163
See application file for complete search history.

(56) References Cited

U.S. PATENT DOCUMENTS

| 5,952,671 | A * | 9/1999 | Reinberg et al. ............ 257/3 |
| 2004/0256694 | A1* | 12/2004 | Kostylev et al. ............ 257/536 |
| 2006/0261321 | A1* | 11/2006 | Happ et al. ............ 257/1 |
| 2007/0096248 | A1* | 5/2007 | Philipp et al. ............ 257/528 |
| 2007/0117315 | A1* | 5/2007 | Lai et al. ............ 438/257 |

FOREIGN PATENT DOCUMENTS

| EP | 1 780 814 A | 5/2007 |
| WO | WO 2005/041196 | 5/2005 |
| WO | WO 2006/079952 A1 | 8/2006 |

OTHER PUBLICATIONS

Hudgens et al., "Overview of Phase-Change Chalcogenide Nonvolatile Memory Technology," *MRIS Bulletin*, Nov. 2004, pp. 829-832.
Lankhorst et al., "Low-cost and nanoscale non-volatile memory concept for future silicon chips," *Nature Materials*, vol. 4, Apr. 2005, pp. 347-352.
International Search Report and Written Opinion, May 8, 2008.
P. Haring Bolivar et al., "Lateral Design for Phase Change Random Access Memory Cells with Low-Current Consumption," European Symposium on Phase Change and Ovonic Science E*PCOS 04, Balzers, Liechtenstein, Sep. 4-7, 2004.
Written Opinion of the International Searching Authority, Mar. 12, 2009.

* cited by examiner

*Primary Examiner* — Thanh V Pham
*Assistant Examiner* — Jami M Valentine
(74) *Attorney, Agent, or Firm* — Dickstein Shapiro LLP

(57) ABSTRACT

Phase change memory elements, devices and systems using the same and methods of forming the same are disclosed. A memory element includes first and second electrodes, and a phase change material layer between the first and second electrodes. The phase change material layer has a first portion with a width less than a width of a second portion of the phase change material layer. The first electrode, second electrode and phase change material layer may be oriented at least partially along a same horizontal plane.

9 Claims, 7 Drawing Sheets

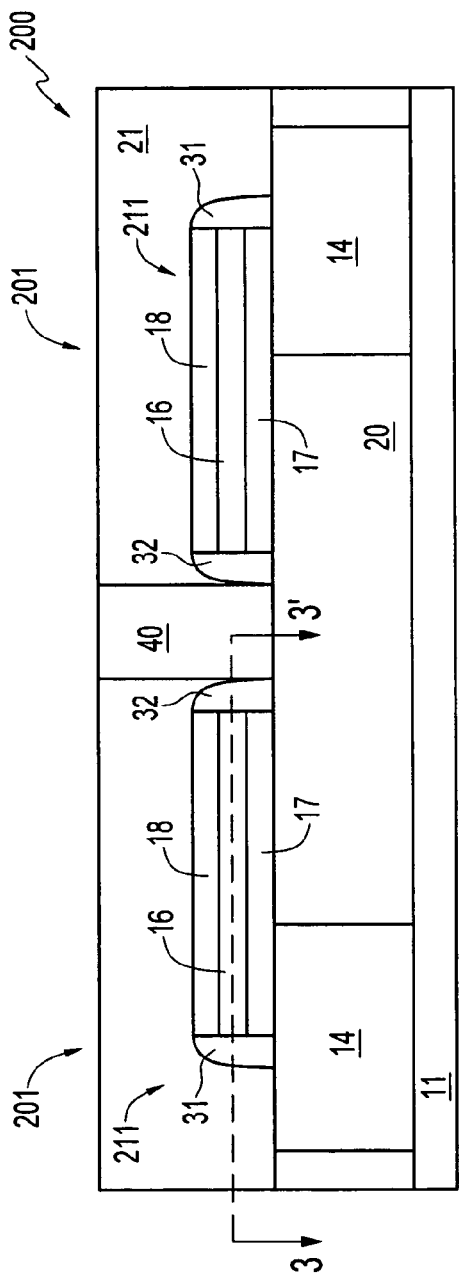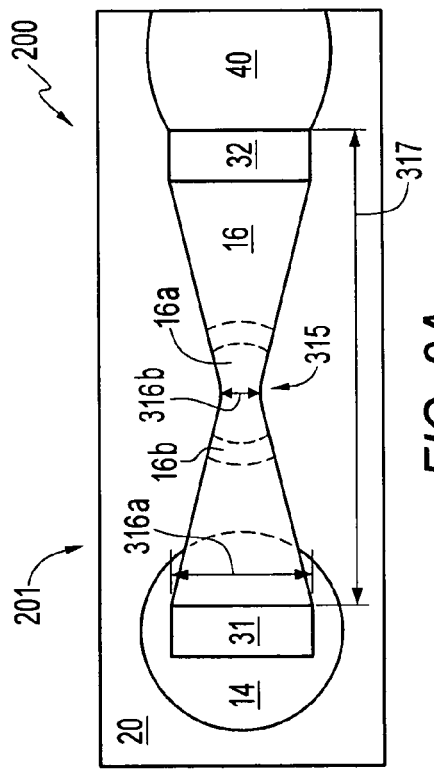

SELF-ALIGNED, PLANAR PHASE CHANGE MEMORY ELEMENTS AND DEVICES

FIELD OF THE INVENTION

Embodiments of the invention relate to semiconductor devices and, in particular, to phase change memory elements and methods of forming and using the same.

BACKGROUND OF THE INVENTION

Non-volatile memories are useful elements of integrated circuits due to their ability to maintain data absent a power supply. Phase change materials have been investigated for use in non-volatile memory cells. Phase change memory elements include phase change materials, such as chalcogenide alloys, which are capable of stably transitioning between amorphous and crystalline phases. Each phase exhibits a particular resistance state and the resistance states distinguish the logic values of the memory element. Specifically, an amorphous state exhibits a relatively high resistance, and a crystalline state exhibits a relatively low resistance.

A conventional phase change memory element 1, illustrated in FIGS. 1A and 1B, has a layer of phase change material 8 between first and second electrodes 2, 4, which are supported by a dielectric material 6. The phase change material 8 is set to a particular resistance state according to the amount of current applied between the first and second electrodes 2, 4. To obtain an amorphous state (FIG. 1B), a relatively high write current pulse (a reset pulse) is applied through the conventional phase change memory element 1 to melt at least a portion 9 of the phase change material 8 covering the first electrode 2 for a first period of time. The current is removed and the phase change material 8 cools rapidly to a temperature below the crystallization temperature, which results in the portion 9 of the phase change material 8 covering the first electrode 2 having the amorphous state. To obtain a crystalline state (FIG. 1A), a lower current write pulse (a set pulse) is applied to the conventional phase change memory element 1 for a second period of time (typically longer in duration than the crystallization time of amorphous phase change material) to heat the amorphous portion 9 of the phase change material 8 to a temperature below its melting point, but above its crystallization temperature. This causes the amorphous portion 9 of the phase change material 8 to re-crystallize to the crystalline state that is maintained once the current is removed and the conventional phase change memory element 1 is cooled. The phase change memory element 1 is read by applying a read voltage, which does not change the phase state of the phase change material 8.

One drawback of conventional phase change memory is the large programming current needed to achieve the phase change. This requirement leads to large access transistor design to achieve adequate current drive. Another problem associated with the memory element 1, is poor reliability due to uncontrollable mixing of amorphous and polycrystalline states at the edges of the programmable volume (i.e., portion 9). Accordingly, it is desirable to have phase change memory devices with reduced programming requirements and increased reliability. Additionally, since in the memory element 1, the phase change material 8 is in direct contact with a large area of the first electrode 2, there is a large heat loss resulting in a large reset current requirement.

Accordingly, alternative designs are needed to address the above noted problems.

BRIEF DESCRIPTION OF THE DRAWINGS

FIG. 2 illustrates partial cross-sectional view respectively of a phase change memory device according to an embodiment of the invention.

FIGS. 3A-3D illustrate top-down views of the phase change memory device of FIG. 2 along the line 3-3' according to embodiments of the invention.

DETAILED DESCRIPTION OF THE INVENTION

In the following detailed description, reference is made to various embodiments of the invention. These embodiments are described with sufficient detail to enable those skilled in the art to practice them. It is to be understood that other embodiments may be employed, and that various structural, logical and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Embodiments of the invention provide phase change memory devices having planar memory elements. The embodiments are now explained with reference to the figures, which illustrate embodiments and throughout which like reference numbers indicate like features. FIG. 2 illustrates a cross-sectional view of a portion of a phase change memory device 200 constructed in accordance with embodiments of the invention. FIGS. 3A-3D are top-down views of a portion of the memory device 200 along the line 3-3' according to the embodiments.

Figure 1A:
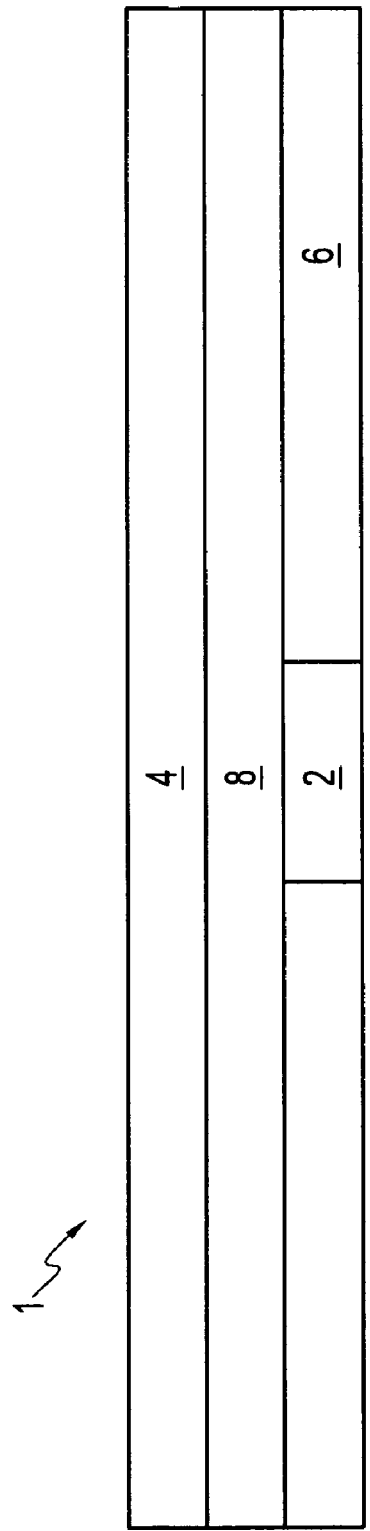
FIGS. 1A and 1B illustrate a conventional phase change memory element.
Figure 1B:
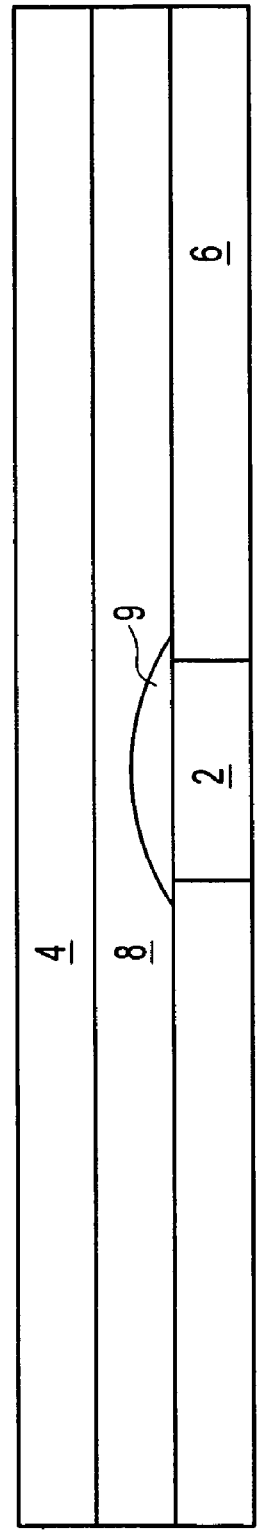

The memory device 200 includes memory elements 201, each for storing at least one bit, i.e., logic 1 or 0. As described in more detail below, the memory elements 201 are planar and configured to have a reduced programming volume and/or programming voltage as compared to the memory element 1 (FIG. 1A).

Figure 5:
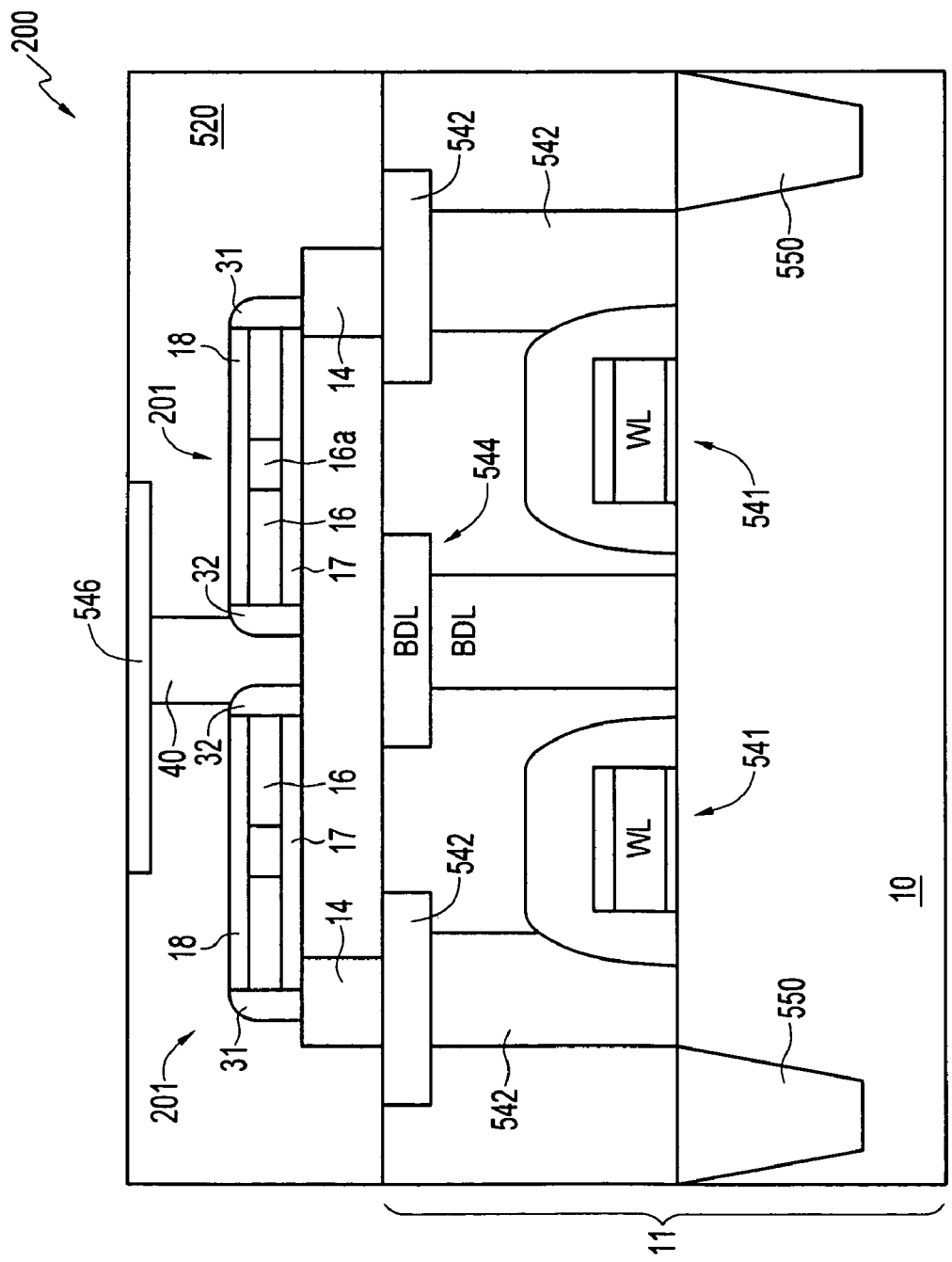
FIG. 5 is a partial cross-sectional view of the phase change memory device of FIG. 2 showing additional circuitry according to an embodiment of the invention.

Referring to FIG. 2, conductive plugs 14 are formed within a first dielectric layer 20 and over a substrate 11. As shown in FIG. 5 and described in more detail below, the substrate 11 can include additional devices and structures. Each memory element 201 is formed over and in communication with a respective conductive plug 14. Each memory element 201 includes a layer of phase change material 16 and self-aligned first and second electrodes 31, 32. Each first electrode 31 is in contact with a respective conductive plug 14. Alternatively, more than one first electrode 31 can be in contact with a same conductive plug 14. Each second electrode is in contact with a conductive interconnect 40, which is connected to a second electrode select line 546 (FIG. 5).

In the memory elements 201, the first electrode 31 and second electrode 32 are at opposing ends of the phase change material 16 at least partially along a same horizontal plane. Thus, the memory elements 201 are planar. In the illustrated embodiment, the phase change material layer 16 is vertically disposed between second and third dielectric layers 17, 18. The phase change material layer 16 and second and third dielectric layers 17, 18 are arranged in a stack 211. The first and second electrodes 31, 32 are formed on sidewalls of the stack 211.

As shown in FIG. 3A, from a top-down perspective, the stack 211, including the phase change material layer 16, has a variable width (e.g., widths 316a, 316b) along the length 317 of the phase change material layer 16. For purposes of this specification, the length of the phase change material layer is measured along the distance between the first and second electrodes 31, 32 from the top-down perspective of FIG. 3A. The width of the phase change material layer 16 is measured along the distance perpendicular to the length as indicated in FIG. 3A.

In the embodiment of FIG. 3A, the portions of the phase change material layer 16 adjacent the electrodes 31, 32 have a greater width 316a than the width 316b of a portion of the phase change material layer 16 at a distance between the electrodes 31, 32. The width of the phase change material layer 16 of FIG. 3A is shown progressively decreasing linearly from each electrode 31, 32 to approximately the center 315 having width 316b. It should be understood that the narrowest portion of the phase change material layer 16 need not be centered between the electrodes 31, 32, but can instead be closer to one or the other of the electrodes 31, 32.

Figure 3B:
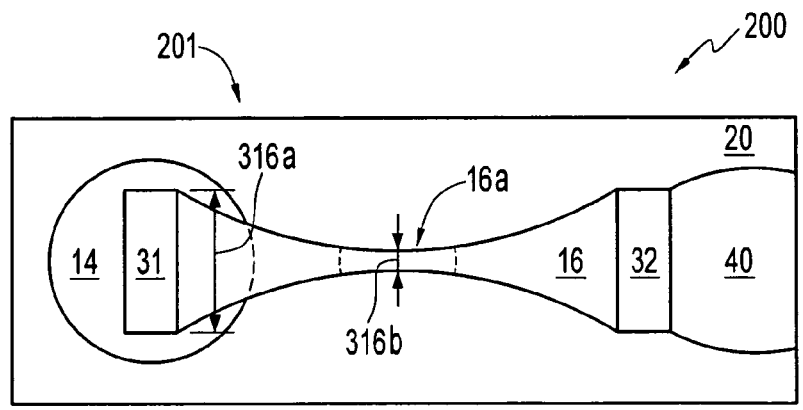
Figure 3C:
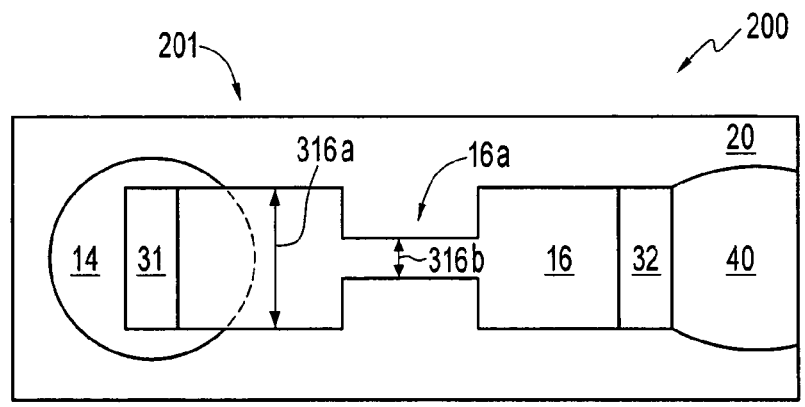
Figure 3D:
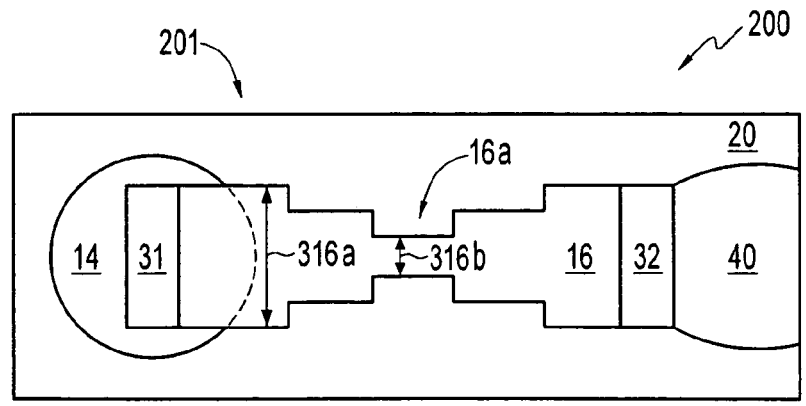

FIGS. 3B-3D are top-down views of a portion of the memory device 200 along the line 3-3' according to other embodiments. As shown in FIG. 3B, the portion of the phase change material layer having a narrow width is extended as compared to that shown in FIG. 3A. Alternatively, as shown in FIGS. 3C and 3D, the width of the phase change material layer progressively decreases in a step-wise manner from each electrode 31, 32 to approximately the center 315 having width 316b. Further, while the phase change material layer 16 is shown having a narrowest width at the center 315, the phase change material layer 16 can have a narrowest width at other points. Further other shapes, e.g., an hourglass shape among others, are possible such that the phase change material layer 16 varies in width between the first and second electrodes 31, 32.

By providing a narrow width 316b between the electrodes 31, 32, during operation, current crowding is induced and the programmable volume 16a corresponds to a region of the phase change material layer 16 at and adjacent to the portion having the narrow width 316b. This reduces heat loss through the electrodes 31, 32. This configuration enables better scalability since the scale would not be limited by electrode 31, 32 heat loss. The induced current crowding also enables a full reset state of the programmable volume 16a to improve the on/off resistance ratio of the element 201 and reduce the threshold voltage. Additionally, the programmable volume 16a and programming voltages can be reduced as compared to that in a conventional vertical memory element 1 (FIG. 1A).

The memory device 200 is operated to have two or more resistance states. This is accomplished by applying a reset current pulse to change the programmable volume 16a of the phase change material 16 between the crystalline and amorphous states. If, for example, three resistance states are desired, the reset current is controlled to change a second programmable volume 16b between the crystalline and amorphous states. Additional resistance states are achieved by controlling the reset current pulse to change additional programmable volumes between the crystalline and amorphous states. Thus, the device 200 can be operated such that the phase change material layers 16 of the elements 201 have more than one programmable volume. Compared to multi-state programming in conventional memory devices, the device 200 enables improved stability, repeatability, reliability and consistency since the programmable volume 16a can be provided at a distance from the electrodes and the phase change can be complete.

Referring to FIGS. 2 and 3, each first electrode 31 is over and in contact with a respective conductive plug 14. Each second electrode is in contact with a conductive interconnect 40 formed in a fourth dielectric layer 21. As depicted in FIG. 2, the conductive interconnect 40 is formed between and self-aligned to the second electrodes 32 of adjacent memory elements 201.

FIGS. 4A-4D illustrate one embodiment of fabricating the phase change memory device 200 illustrated in FIGS. 2-3D. No particular order is required for any of the actions described herein, except for those logically requiring the results of prior actions. Accordingly, while the actions below are described as being performed in a specific order, the order can be altered if desired.

Figure 4A:
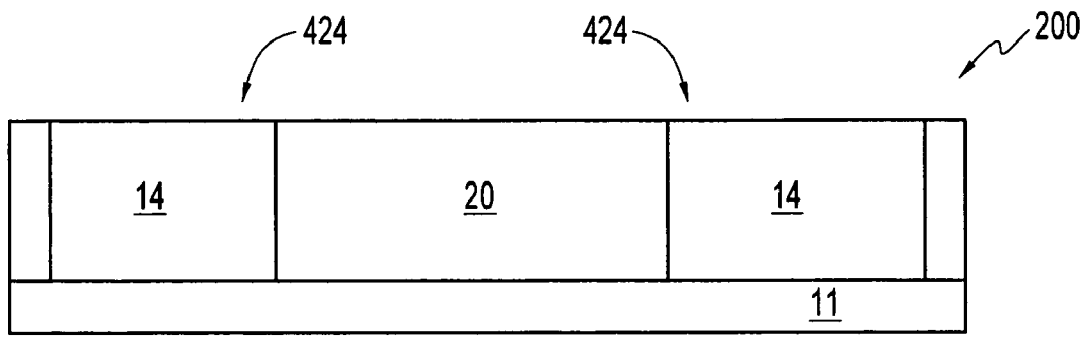
FIGS. 4A-4D illustrate partial cross-sectional views of a method of fabricating the phase change memory device of FIGS. 2A and 2B.

As shown in FIG. 4A a first dielectric layer 20 is formed over a substrate 11. The first dielectric layer 20 is etched to create vias 424 within which conductive plugs 14 are formed. The conductive plugs 14 are formed of any suitable conductive material, such as titanium-nitride (TiN), titanium-aluminum-nitride (TiAlN), titanium-tungsten (TiW), platinum (Pt) or tungsten (W), among others.

Figure 4B:
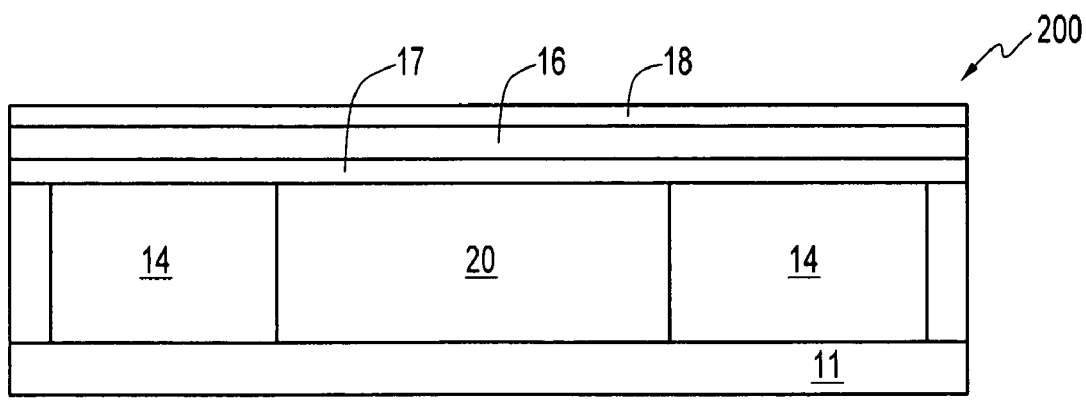

As depicted in FIG. 4B, a second insulating layer 17, a phase change material layer 16 and a third insulating layer 18 are deposited over the conductive plugs 14 and the first insulating layer 20. The layers 16, 17, 18 are formed as blanket layers. The programmable volume 316 (FIGS. 3A-3D) is adjusted by adjusting the thickness of the phase change material layer 16.

In the illustrated embodiment, the phase change material 16 is a chalcogenide material, for example, germanium-antimony-telluride and has a thickness of, for example, about 100 Å. The phase change materials can also be or include other phase change materials, for example, In—Se, Sb2Te3, GaSb, InSb, As—Te, Al—Te, GeTe, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

Figure 4C:
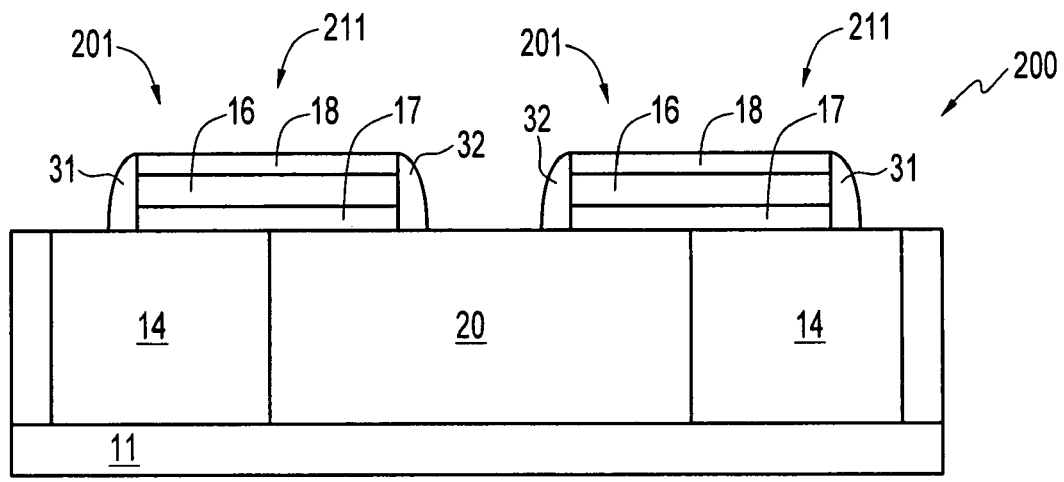

FIG. 4C illustrates the patterning and etching of the layers 16, 17, 18 into stacks 211 for individual memory elements 201. Also, a conformal conductive layer is formed over the stacks 211. A spacer etch is performed to form the self-aligned electrodes 31, 32 as sidewalls on the stacks 211. The electrodes 31, 32 are formed of any suitable conductive material, such as titanium-nitride (TiN), among others. The stacks 211 are each formed partially overlying a respective conductive plug, such that when the first electrodes 31 are formed on a sidewall of the stacks 211, the first electrodes 31 are in contact with a respective conductive plug 14.

The stacks 211 are further patterned and a dry etch step is conducted to shape the stacks, including the phase change material layer 16 to have a shape shown in one of FIGS. 3A-3D or as desired and in accordance with the invention.

Figure 4D:
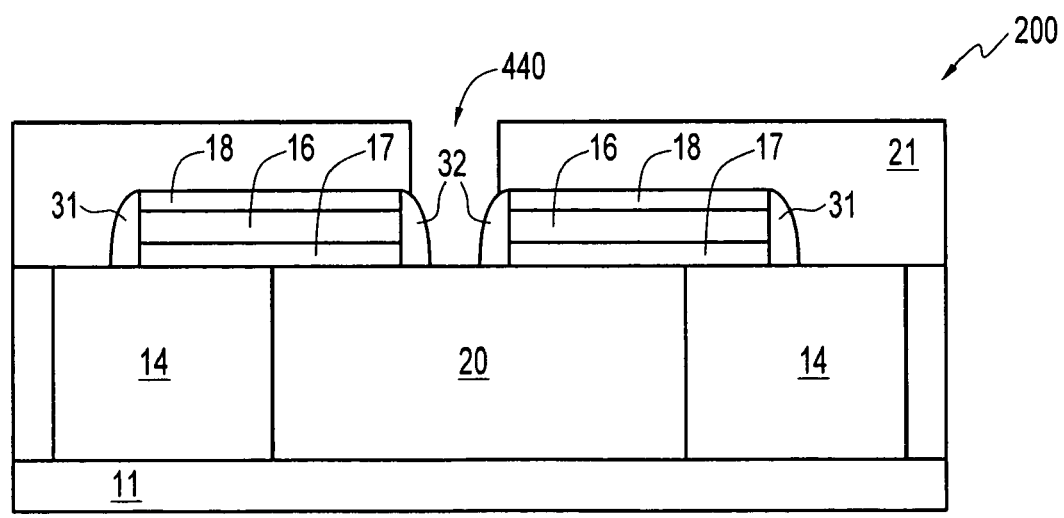

As shown in FIG. 4D, a fourth dielectric layer 21 is formed over the stacks 211 and electrodes 31, 32. A via 440 is formed in the fourth dielectric layer 21 to expose the second electrodes 32 of adjacent memory elements 201. To achieve the structure shown in FIG. 2, a conductive material is deposited within the via 440 self-aligned to and in contact with the second electrodes 32.

Additional structures can be formed to complete the memory device 200. For example, bit line 544, word lines 541, second electrode select line 546 and conductive interconnects 542, as shown and described below in connection with FIG. 5.

FIG. 5 is a partial cross-sectional view of the phase change memory device of FIG. 2 showing additional circuitry according to an embodiment of the invention. The memory elements 201 overlie bit line 544, word lines 541 and conductive interconnects 542, which are supported by substrate 10. Isolation regions 550 within the substrate 10 isolate the various elements of the memory device 200. The structure shown in FIG. 5 is only one example and other circuit designs including one or more memory elements 201 and/or the memory device 200 according to embodiments of the invention are contemplated as within the scope of the invention.

Figure 6:
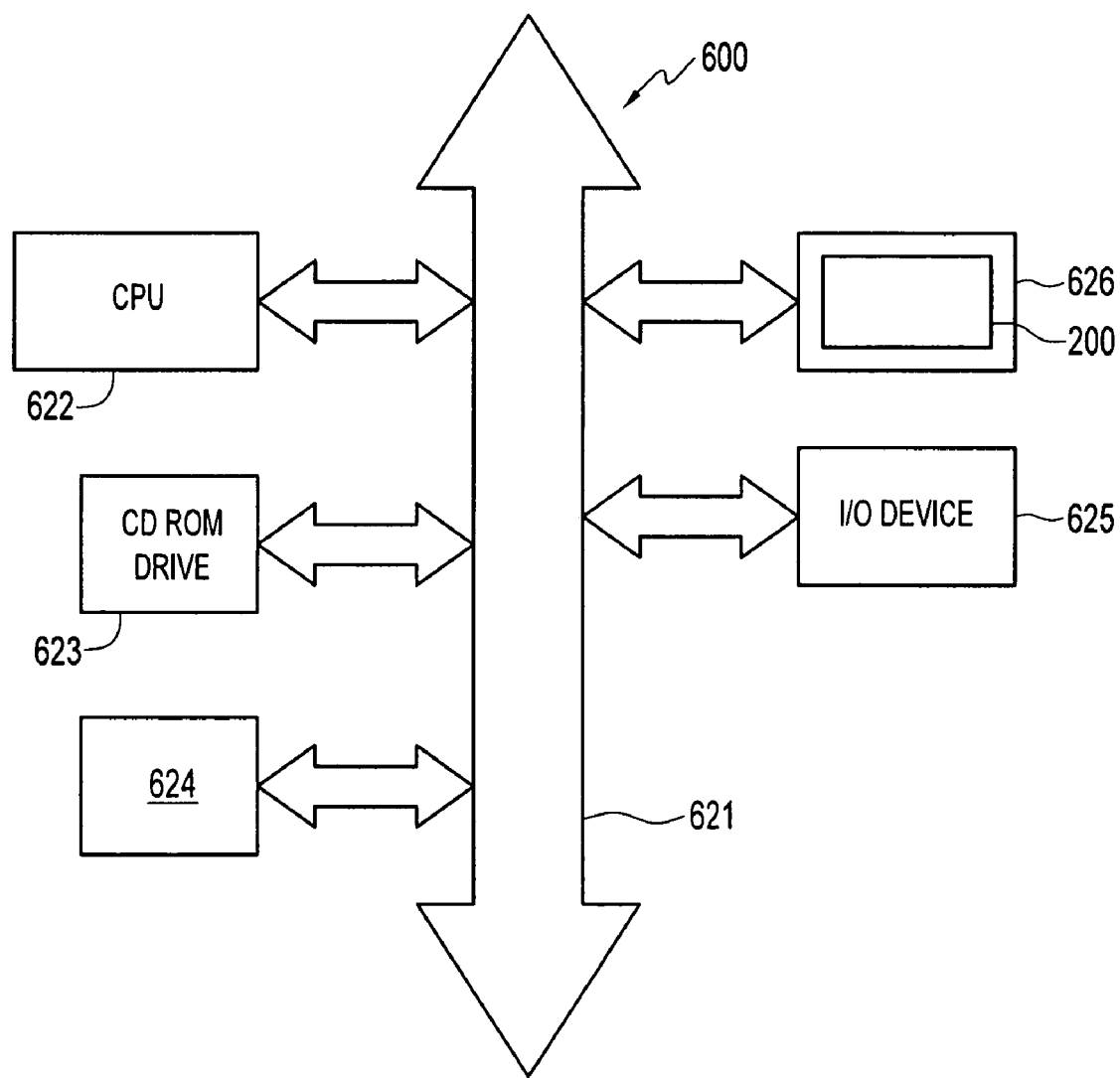
FIG. 6 is a block diagram of a processor system having a memory device incorporating a phase change memory element constructed in accordance with an embodiment of the invention.

FIG. 6 illustrates a simplified processor system 600 which includes a memory circuit 626 having a phase change memory device 200 constructed in accordance with the invention.

The FIG. 6 processor system 600, which can be any system including one or more processors, for example, a computer, PDA, phone or other control system, generally comprises a central processing unit (CPU) 622, such as a microprocessor, a digital signal processor, or other programmable digital logic devices, which communicates with an input/output (I/O) device 625 over a bus 621. The memory circuit 626 communicates with the CPU 622 over bus 621 typically through a memory controller. The memory circuit 626 includes the memory device 200 (FIGS. 2-3). Alternatively, the memory circuit 626 can include one or more of the memory elements 201.

In the case of a computer system, the processor system 600 may include peripheral devices such as a compact disc (CD) ROM drive 623 and hard drive 624, which also communicate with CPU 622 over the bus 621. If desired, the memory circuit 626 may be combined with the processor, for example CPU 622, in a single integrated circuit.

The above description and drawings are only to be considered illustrative of specific embodiments, which achieve the features and advantages described herein. Modification and substitutions to specific process conditions and structures can be made. Accordingly, the embodiments of the invention are not to be considered as being limited by the foregoing description and drawings, but is only limited by the scope of the appended claims.

The invention claimed is:

1. A memory element comprising:
    a substrate,
    first and second electrodes, each located on a same horizontal plane that is parallel to the substrate;
    first and second dielectric materials between the first and second electrodes; and
    a planar phase change material between the first and second electrodes, located on the horizontal plane and vertically disposed between and in contact with the first and second dielectric materials such that the first and second dielectric materials and the phase change material form a stack, the first electrode formed on a first sidewall of the stack and the second electrode being formed on a second sidewall of the stack, the stack having at least first, second and third portions, the first portion having a width less than the widths of the second and third portions,
    wherein the second portion is in contact with the first electrode and the third portion is in contact with the second electrode, wherein the first portion is between the second and third portions, wherein the second portion is between the first electrode and the first portion, and wherein the third portion is between the second electrode and the first portion, such that a programmable volume of the phase change material is not in contact with the first or second electrodes.

2. The memory element of claim 1, wherein the first portion comprises the programmable volume.

3. The memory element of claim 1, wherein a width of the stack progressively decreases from the second and third portions to the first portion.

4. The memory element of claim 1, wherein the programmable volume is approximately centered between the first and second electrodes.

5. The memory element of claim 1, further comprising at least one conductive plug, wherein the first electrode is in contact with the at least one conductive plug.

6. The memory element of claim 1, wherein, the first and second electrodes are self-aligned to the phase change material.

7. The memory element of claim 3, wherein a width of the stack decreases in a step-wise manner from the second and third portions to the first portion.

8. The memory element of claim 3, wherein a width of the stack decreases linearly from the second and third portions to the first portion.

9. A memory device comprising:
    at least two memory elements according to claim 1; and
    a conductive interconnect, wherein the first and second electrodes of the at least two memory elements are located along the horizontal plane, and wherein the conductive interconnect is in contact with second electrodes of the at least two memory elements.

* * * * *